(12) United States Patent
Tsai

(10) Patent No.: US 6,251,748 B1
(45) Date of Patent: Jun. 26, 2001

(54) METHOD OF MANUFACTURING SHALLOW TRENCH ISOLATION STRUCTURE

(75) Inventor: Meng-Jin Tsai, Kaohsiung (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/165,257

(22) Filed: Oct. 1, 1998

(30) Foreign Application Priority Data

May 5, 1998  (TW) ................................................ 87106885

(51) Int. Cl.[7] .................................................... H01L 21/76
(52) U.S. Cl. ........................ 438/425; 438/437; 438/762
(58) Field of Search ..................................... 438/436, 424, 438/435, 437, 438, 978, 788, 296, 762, 425

(56) References Cited

U.S. PATENT DOCUMENTS

| | | | |
|---|---|---|---|
| 5,447,884 | * | 9/1995 | Fahey ........................................ 437/67 |
| 5,552,332 | * | 9/1996 | Tseng et al. ............................. 437/41 |
| 5,811,315 | * | 9/1998 | Yindeepol et al. ..................... 437/62 |
| 5,966,615 | * | 10/1999 | Fazen .................................... 438/424 |
| 5,985,735 | * | 11/1999 | Moon et al. ........................... 438/435 |
| 5,989,978 | * | 11/1999 | Peidous ................................. 438/436 |
| 5,998,278 | * | 12/1999 | Yu ........................................ 438/424 |
| 6,074,927 | * | 6/2000 | Kepler et al. ......................... 438/400 |

* cited by examiner

Primary Examiner—Mary Wilczewski
Assistant Examiner—Dave Goodwin
(74) Attorney, Agent, or Firm—Thomas, Kayden, Horstemeyer & Risley

(57) ABSTRACT

A method of manufacturing shallow trench isolation structure comprising the steps of forming a polysilicon mask layer over a substrate, and then patterning the polysilicon mask layer and the substrate to form a trench. Thereafter, a silicon nitride layer is formed covering the sidewalls of the trench. Next, a high-density chemical vapor deposition method is used to deposit oxide material into the trench. Finally, the surface is polished to remove a portion of the oxide layer and the silicon nitride layer until the polysilicon mask layer is exposed. The shallow trench isolation structure can avoid subthreshold kink effect and reduce subthreshold leakage current.

11 Claims, 4 Drawing Sheets

METHOD OF MANUFACTURING SHALLOW TRENCH ISOLATION STRUCTURE

CROSS-REFERENCE TO RELATED APPLICATION

This application claims the priority benefit of Taiwan application serial no. 87106885, filed May 5, 1998, the full disclosure of which is incorporated herein by reference.

BACKGROUND OF THE INVENTION

1. Field of Invention

The present invention relates to a method of manufacturing an integrated circuit device isolation structure. More particularly, the present invention relates to a method of manufacturing shallow trench isolation (STI) structure.

2. Description of Related Art

Device isolation regions are generally used for preventing the flow of mobile carriers from one device to its neighboring devices through the substrate. Conventionally, device isolation regions are formed between neighboring field effect transistors (FET) of densely packed semiconductor circuits such as dynamic random access memories (DRAMs). These device isolation regions are capable of reducing charge leakage from the field effect transistors. In general, device isolation regions take the form of an extended layer of thick oxide above a semiconductor substrate formed by a local oxidation of silicon (LOCOS) method. As fabrication using the LOCOS techniques gradually matures, highly reliable device isolation structure can be obtained at low cost. However, the LOCOS method of forming isolation structure has a number of problems including the possible generation of large internal stress and the bird's beak encroachment at the periphery of the field oxide layer. In particular, as devices are miniaturized, the bird's beak encroachment region will become so large that using LOCOS field oxide to isolate devices is infeasible.

Another commonly used method of isolating devices is the shallow trench isolation (STI). In general, a STI structure is formed by depositing a silicon nitride layer over a semiconductor substrate, then patterning the silicon nitride layer to form a hard mask. Next, the substrate is etched to form steep-sided trenches between neighboring devices. Finally, oxide material is deposited into the trenches to form device isolation structure that has roughly the same height as the original substrate surface.

FIGS. 1 through 7 are cross-sectional views showing the progression of manufacturing steps in producing shallow trench isolation structure according to a conventional method.

First, as shown in FIG. 1, an oxide layer 22 is formed over a silicon substrate 10. The oxide layer 22 is a pad oxide layer whose function is to protect the substrate surface, and hence will ultimately be removed before the gate oxide layer is formed. Thereafter, a chemical vapor deposition (CVD) process is used to form a silicon nitride layer 24 over the oxide layer 22. Next, photoresist is deposited over the silicon nitride layer 24, and then photolithographic process is used to develop a patterned photoresist layer 28. Subsequently, the patterned photoresist layer 28 is used as a mask to etch away a portion of the silicon nitride layer 24, the pad oxide layer 22 and the silicon substrate 10. Hence, a trench 30 is formed in the substrate 10. Thereafter, the photoresist layer 28 is removed.

Next, as shown in FIG. 2, a thermal oxidation method is used to form a linear oxide layer 31 lining the surface of the trench 30. Thereafter, a silicon oxide layer 32 is formed by depositing silicon oxide material into the trench 30 and overflowing to cover the silicon nitride layer 24 as well. The silicon oxide layer 32 is formed by an atmospheric pressure chemical vapor deposition method (APCVD) using tetra-ethyl-ortho-silicate (TEOS) as gaseous reactant. The TEOS oxide layer 32 needs to be densified, and therefore must be heated to about 1000° C. for about 10 to 30 minutes. After the densification operation, the TEOS oxide will contract a little.

Next, as shown in FIG. 3, using the silicon nitride layer 24 as an etching stop, a chemical-mechanical polishing (CMP) method is used to remove the TEOS oxide layer lying above the silicon nitride layer 24. Ultimately, oxide plugs 34 remain inside the trenches 30. Because the oxide plug 34 is softer than the surrounding silicon nitride material, a tiny portion of oxide material on the upper surface of the oxide plug 34 is removed forming minor recesses.

Next, as shown in FIG. 4, the silicon nitride layer 24 is removed exposing a portion of the oxide plug 34 above the pad oxide layer 22. The silicon nitride layer 24 can be removed using hot phosphoric acid solution, for example.

Next, as shown in FIG. 5, the pad oxide layer 22 is removed by immersing in hydrofluoric acid. Since the TEOS oxide plug 34 has a considerably higher etching rate than the pad oxide layer 22, a thicker layer of oxide plug material will be removed by the time the pad oxide layer 22 is completely removed. Ultimately, the TEOS oxide plugs 34 will be roughly at the same height level as the substrate surface.

Next, as shown in FIG. 6, a sacrificial oxide layer 36 is formed over the substrate 10 acting as a protective layer. Then, according to the needs of a particular device, one or more ion implants are carried out to adjust the channel threshold voltage.

Next, as shown in FIG. 7, hydrofluoric acid solution is again used to remove the sacrificial oxide layer 36. In the etching operation, over-etching of the oxide plug 34 often occurs. Consequently, recesses are often formed on the upper surface of the oxide plugs 34. These recesses are at a level below the substrate surface 10 and are labeled 38 and 39 in FIG. 7.

In the presence of these recesses 38, subthreshold kink effect will be intensified resulting in abnormal subthreshold current, and hence will turn on the channel of a transistor erroneously.

In light of the foregoing, there is a need to provide an improved method of manufacturing shallow trench isolation structure.

SUMMARY OF THE INVENTION

Accordingly, the present invention is to provide a method of manufacturing shallow trench isolation structure capable of reducing subthreshold kink effect due to the presence of recesses on oxide plug surface.

To achieve these and other advantages and in accordance with the purpose of the invention, as embodied and broadly described herein, the invention provides a method of manufacturing shallow trench isolation structure. The method comprises the steps of forming a polysilicon mask layer over a substrate, and then patterning the polysilicon mask layer and the substrate to form trenches. Thereafter, a silicon nitride layer is formed covering the sidewalls of the trenches. Next, a high-density chemical vapor deposition method is used to deposit oxide material into the trenches.

Subsequently, the surface is polished to remove a portion of the oxide layer and the silicon nitride layer until the polysilicon mask layer is exposed. Finally, operations for completing the shallow trench isolation structure are carried out.

The shallow trench isolation structure of this invention is capable of minimizing subthreshold kink effect and subthreshold leakage current.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
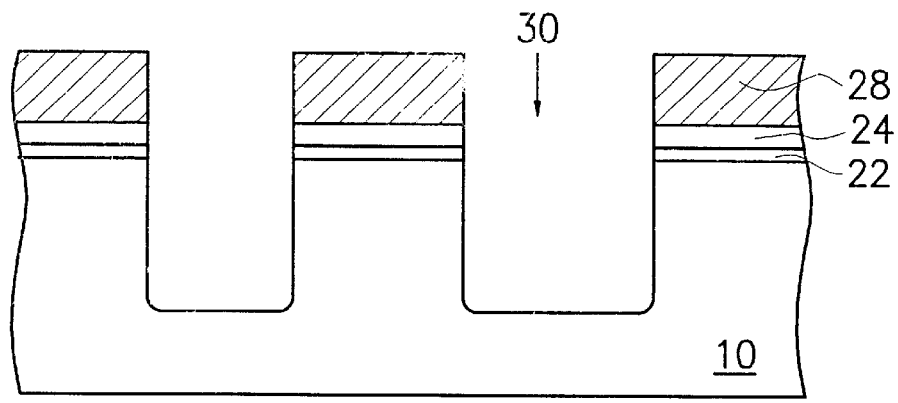
FIGS. 1 through 7 are cross-sectional views showing the progression of manufacturing steps in producing shallow trench isolation structure according to a conventional method.
Figure 2:
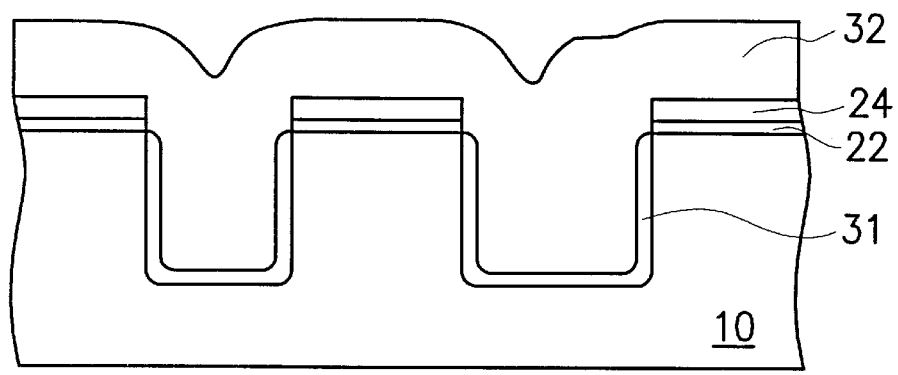
Figure 3:
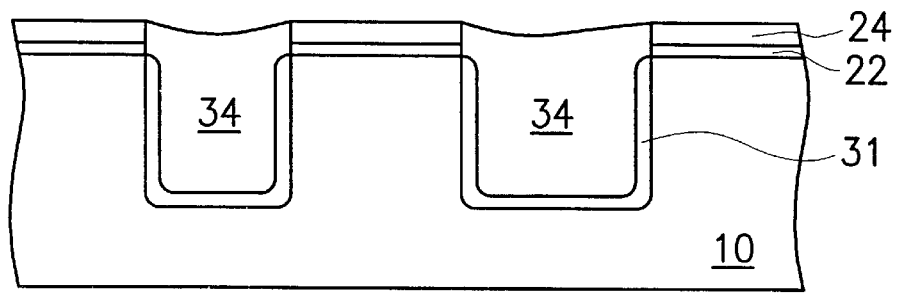
Figure 4:
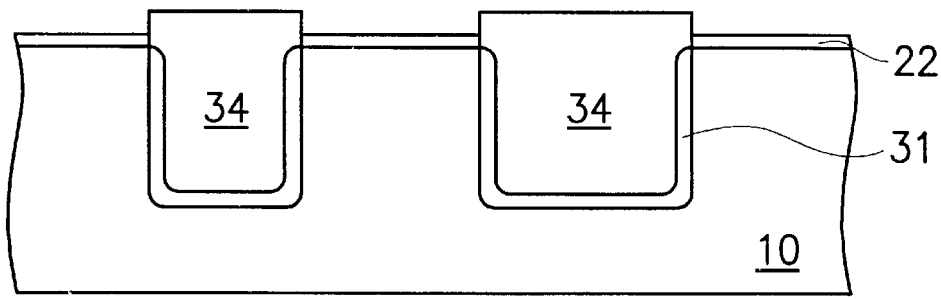
Figure 5:
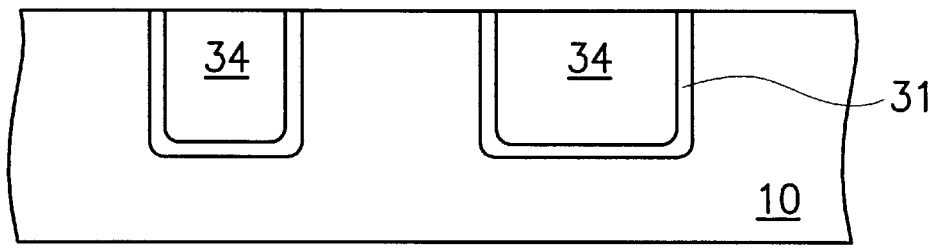
Figure 6:
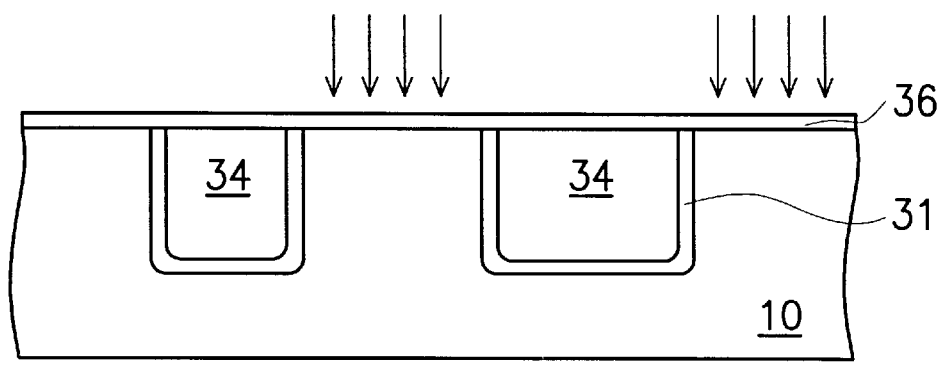
Figure 7:
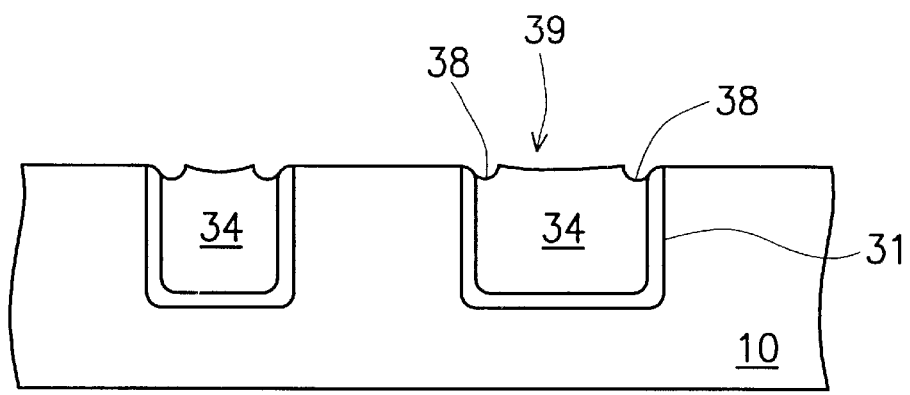

Reference will now be made in detail to the present preferred embodiments of the invention, examples of which are illustrated in the accompanying drawings. Wherever possible, the same reference numbers are used in the drawings and the description to refer to the same or like parts.

FIGS. 8 through 13 are cross-sectional views showing the progression of manufacturing steps in producing shallow trench isolation structure according to one preferred embodiment of this invention.

Figure 8:
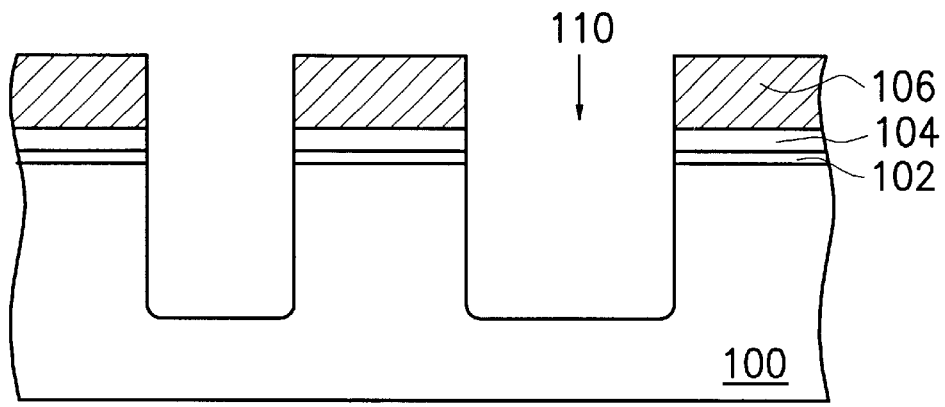
FIGS. 8 through 13 are cross-sectional views showing the progression of manufacturing steps in producing shallow trench isolation structure according to one preferred embodiment of this invention.

First, as shown in FIG. 8, a silicon substrate 100 having P-type background dopants or a P-doped surface layer is provided. Next, a pad oxide layer 102 is formed over the silicon substrate 100. This pad oxide layer 102 is used as a protective cover preventing any damages to the substrate surface in subsequent operations. The pad oxide layer 102 having a thickness of about 50Å to 500Å can be formed by a thermal oxidation method. Thereafter, a mask layer 104 is deposited over the pad oxide layer 102. The mask layer 104 can be, for example, a polysilicon layer that can serve as an etching stop layer in subsequent chemical-mechanical polishing operation.

Next, a photoresist layer 106 is formed over the mask layer 104, and then the photoresist layer 106 is patterned to form an etching mask. Thereafter, using the patterned photoresist layer 106 as a mask, the mask layer 104, the pad oxide layer 102 and the substrate 100 are etched to form a trench 110. Etching of the mask layer 104, the pad oxide layer 102 and the substrate 100 can be carried out using, for example, a dry etching method or a wet etching method. In general, when an anisotropic etching method is selected for etching the silicon substrate, a trench with depth of about 2000Å to 5000Å can be obtained.

Figure 9:
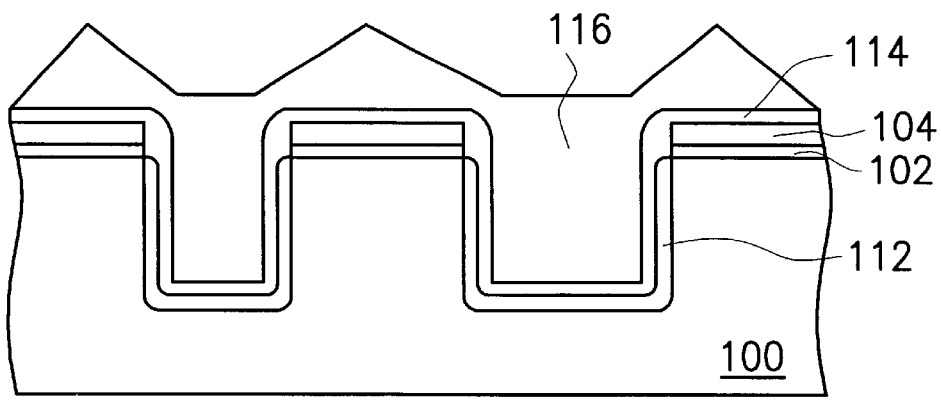

Next, as shown in FIG. 9, after the trench 110 is formed, conventional method is used to remove the photoresist layer 106. Thereafter, a liner oxide layer 112 is formed over the substrate surface of the trench interior 110 using, for example, a thermal oxidation method. Subsequently, a plasma-enhanced chemical vapor deposition method is used to form a silicon nitride layer 114 over the liner oxide layer 112 of the trench interior 110 as well as covering the mask layer 104. Next, a high-density plasma chemical vapor deposition (HDPCVD) method is used to form an oxide layer 116 that completely fills the trench 110 and over the silicon nitride layer 114. Then, the oxide layer 116 is densified by heating to a temperature of about 1000° C. and maintaining at that temperature for about 10 to 30 minutes. After densification, the oxide layer 116 will contract a little.

Figure 10:
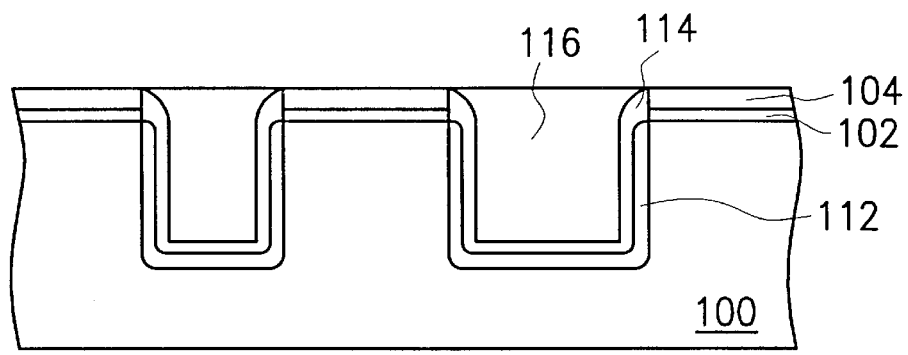

Next, as shown in FIG. 10, a chemical-mechanical polishing (CMP) operation is used to polish the oxide layer 116 and remove the silicon nitride layer 114 until the mask layer 104 is exposed. Finally, the oxide layer 116 and the mask layer 104 are roughly at the same height level.

One major aspect of this invention is the formation of a silicon nitride layer 114 over the trench interior 110 and the mask layer 104. In a high-density plasma chemical vapor deposition operation, the silicon nitride layer 114 can act as a protective layer for the substrate 100 and the mask layer 104. Moreover, using a high-density plasma chemical vapor deposition method to form the oxide layer 116 is able to improve the ultimate uniformity of surface polished by a chemical-mechanical polishing method. Consequently, unlike a conventional process, few recesses will appear on the upper surface of the oxide layer 116 within the trench 110.

Figure 11:
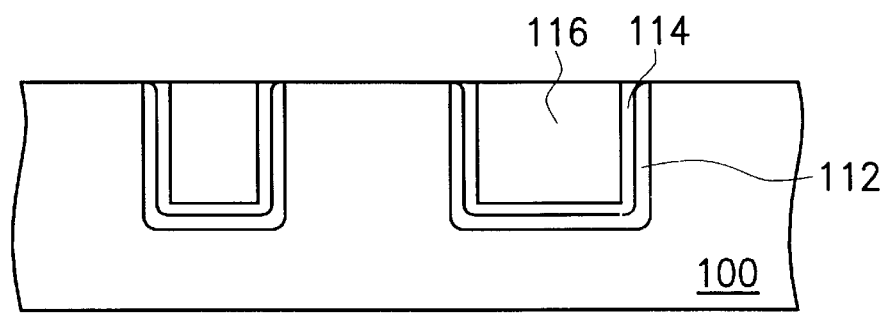

Next, as shown in FIG. 11, the mask layer 104 is removed using, for example, a dry etching method or a wet etching method. Thereafter, sidewall silicon nitride layer 114 higher than the pad oxide layer 102 is removed by immersing in hot phosphoric acid solution for a brief period. Subsequently, the pad oxide layer 102 is removed by immersing in a hydrofluoric acid solution. Since the oxide layer 116 has an etching rate much higher than the pad oxide layer 102, a thicker layer of oxide layer 116 is removed than the pad oxide layer 102. Hence, the oxide layer 116 will be roughly at the same level as the substrate surface 100 when the etching is finished.

Figure 12:
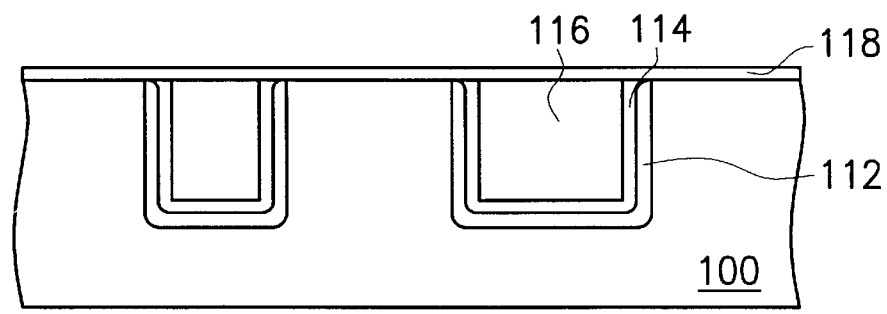

Next, as shown in FIG. 12, a sacrificial oxide layer 118 is formed over the substrate 100 acting as a protective layer. Then, according to the needs of a particular device, one or more ion implant operations are carried out to adjust the channel threshold voltage.

Figure 13:
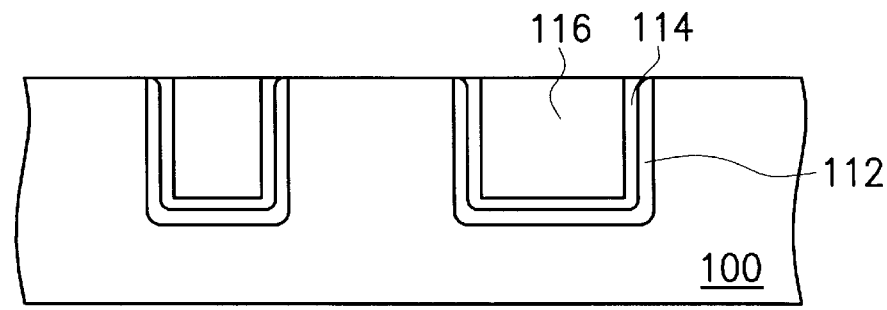

Next, as shown in FIG. 13, hydrofluoric acid solution is again used to remove the sacrificial oxide layer 118. In this invention, since the sidewalls of the trench 100 has a protective silicon nitride layer 114, the formation of recesses in the oxide layer 116 is prevented. Therefore, abnormal subthreshold current due to subthreshold kink effect can be reduced considerably.

In summary, a first feature of this invention is the use of a polysilicon layer as a mask layer so that the mask layer can ultimately be used as a polishing stop layer in subsequent chemical-mechanical polishing operation. Another feature of this invention is the use of a silicon nitride layer to cover the trench interior and the mask layer. Therefore, the silicon nitride layer can act as a protective layer for the substrate and the mask layer when a high-density plasma vapor deposition method is used to deposit an oxide layer. Furthermore, using a high-density plasma vapor deposition method to deposit an oxide layer is capable of improving the resultant surface uniformity in a chemical-mechanical polishing operation. Consequently, very few recesses are formed above the oxide layer. Hence, this invention is capable of reducing subthreshold kink effect and preventing the generation of abnormal subthreshold current.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing shallow trench isolation structure, comprising the steps of:

providing a substrate;

forming a pad oxide layer over the substrate;

forming a polysilicon mask layer over the pad oxide layer;

patterning the polysilicon mask layer, the pad oxide layer and the substrate to form a trench in the substrate;

forming a liner oxide layer over the exposed substrate surface of the trench interior;

forming a silicon nitride layer over the liner oxide layer and the polysilicon mask layer;

depositing oxide material into the trench and over the silicon nitride layer to form an oxide layer;

polishing the oxide layer and the silicon nitride layer until the polysilicon mask layer is exposed;

removing the polysilicon mask layer;

removing the silicon nitride layer at a level higher than the pad oxide layer;

removing the pad oxide layer and a portion of the oxide layer;

forming a sacrificial oxide layer over the substrate;

implanting ions into the substrate; and removing the sacrificial oxide layer.

2. The method of claim 1, wherein the step of forming the oxide layer includes a high-density plasma chemical vapor deposition method.

3. The method of claim 1, wherein the step of forming the pad oxide layer includes a thermal oxidation method.

4. The method of claim 1, wherein the step of forming the liner oxide layer includes a thermal oxidation method.

5. The method of claim 1, wherein the step of forming the sacrificial oxide layer includes a thermal oxidation method.

6. The method of claim 1, wherein the step of polishing the oxide layer and the silicon nitride layer includes a chemical-mechanical polishing method.

7. The method of claim 1, wherein the step of removing the polysilicon mask layer includes a wet etching method.

8. The method of claim 1, wherein the step of removing the polysilicon mask layer includes a dry etching method.

9. The method of claim 1, wherein the step of removing the silicon nitride layer at a level higher than the pad oxide layer includes using hot phosphoric acid solution.

10. The method of claim 1, wherein the steps of removing the pad oxide layer and a portion of the oxide layer include using hydrofluoric acid solution.

11. The method of claim 1, wherein the step of removing the sacrificial oxide layer includes using hydrofluoric acid solution.

* * * * *